(12) United States Patent
Baba et al.

(10) Patent No.: US 11,462,637 B2
(45) Date of Patent: Oct. 4, 2022

(54) SEMICONDUCTOR DEVICE AND MANUFACTURING METHOD FOR THE SAME

(71) Applicants: Kabushiki Kaisha Toshiba, Tokyo (JP); Toshiba Electronic Devices & Storage Corporation, Tokyo (JP)

(72) Inventors: Shotaro Baba, Kanazawa Ishikawa (JP); Yusuke Kobayashi, Nagareyama Chiba (JP); Hiroaki Katou, Nonoichi Ishikawa (JP); Toshifumi Nishiguchi, Hakusan Ishikawa (JP)

(73) Assignees: KABUSHIKI KAISHA TOSHIBA, Tokyo (JP); TOSHIBA ELECTRONIC DEVICES & STORAGE CORPORATION, Tokyo (JP)

( * ) Notice: Subject to any disclaimer, the term of this patent is extended or adjusted under 35 U.S.C. 154(b) by 0 days.

(21) Appl. No.: 17/191,820

(22) Filed: Mar. 4, 2021

(65) Prior Publication Data

US 2022/0085201 A1    Mar. 17, 2022

(30) Foreign Application Priority Data

Sep. 15, 2020  (JP) .............................. JP2020-154752

(51) Int. Cl.
*H01L 29/78*     (2006.01)
*H01L 29/417*    (2006.01)
*H01L 29/66*     (2006.01)

(52) U.S. Cl.
CPC .... *H01L 29/7802* (2013.01); *H01L 29/66712* (2013.01)

(58) Field of Classification Search
CPC ........... H01L 29/7802; H01L 29/66712; H01L 29/0653; H01L 29/42376; H01L 29/407;
(Continued)

(56) References Cited

U.S. PATENT DOCUMENTS 8,866,220 B2    10/2014  Kobayashi
9,337,283 B2     5/2016  Nishiguchi
(Continued)

FOREIGN PATENT DOCUMENTS

JP    2013-62344 A    4/2013
JP    2014-27182 A    2/2014
(Continued)

*Primary Examiner* — Shahed Ahmed
*Assistant Examiner* — Khatib A Rahman
(74) *Attorney, Agent, or Firm* — Allen & Overy LLP

(57) ABSTRACT

According to one embodiment, a semiconductor device includes first, second, and third conductive members, a semiconductor member, and a first insulating member. The semiconductor member includes a first semiconductor region provided on the first conductive member, a second semiconductor region provided on a portion of the first semiconductor region, and a third semiconductor region provided on the second semiconductor region. An impurity concentration in the third semiconductor region is greater than in the first semiconductor region. The second conductive member includes a first conductive portion electrically connected to the second and third semiconductor regions. The third conductive member is provided on an other portion of the first semiconductor region. At least a portion of the first insulating member is between the semiconductor member and the third conductive member. The at least a portion of the first insulating member electrically insulates between the semiconductor member and the third conductive member.

9 Claims, 15 Drawing Sheets

(58) Field of Classification Search
CPC .......... H01L 29/41766; H01L 29/7813; H01L 29/66727
See application file for complete search history.

(56) References Cited

U.S. PATENT DOCUMENTS

| | | | |
|---|---|---|---|
| 9,536,959 B2* | 1/2017 | Kobayashi | H01L 29/42368 |
| 9,917,183 B2* | 3/2018 | Arai | H01L 29/407 |
| 10,121,892 B2* | 11/2018 | Nishiwaki | H01L 29/7813 |
| 2004/0041207 A1* | 3/2004 | Takano | H01L 29/7813 257/330 |
| 2007/0059887 A1* | 3/2007 | Poelzl | H01L 29/7813 438/270 |
| 2008/0283909 A1* | 11/2008 | Akiyama | H01L 29/66734 257/E21.429 |
| 2010/0123193 A1* | 5/2010 | Burke | H01L 21/823487 257/334 |
| 2013/0062688 A1* | 3/2013 | Kobayashi | H01L 29/0878 257/330 |
| 2017/0047444 A1* | 2/2017 | Tanaka | H01L 29/42376 |
| 2017/0062604 A1* | 3/2017 | Katou | H01L 29/7813 |
| 2018/0012956 A1* | 1/2018 | Ohashi | H01L 29/1608 |
| 2019/0088778 A1* | 3/2019 | Kawamura | H01L 29/1095 |

FOREIGN PATENT DOCUMENTS

| | | |
|---|---|---|
| JP | 5799046 B2 | 10/2015 |
| JP | 2016-167519 A | 9/2016 |
| JP | 6426642 B2 | 11/2018 |

* cited by examiner

SEMICONDUCTOR DEVICE AND MANUFACTURING METHOD FOR THE SAME

CROSS-REFERENCE TO RELATED APPLICATIONS

This application is based upon and claims the benefit of priority from Japanese Patent Application No. 2020-154752, filed on Sep. 15, 2020; the entire contents of which are incorporated herein by reference.

FIELD

Embodiments described herein generally relate to a semiconductor device and a method for manufacturing the semiconductor device.

BACKGROUND

It is desirable to improve the characteristics of a semiconductor device.

DETAILED DESCRIPTION

Figure 1:
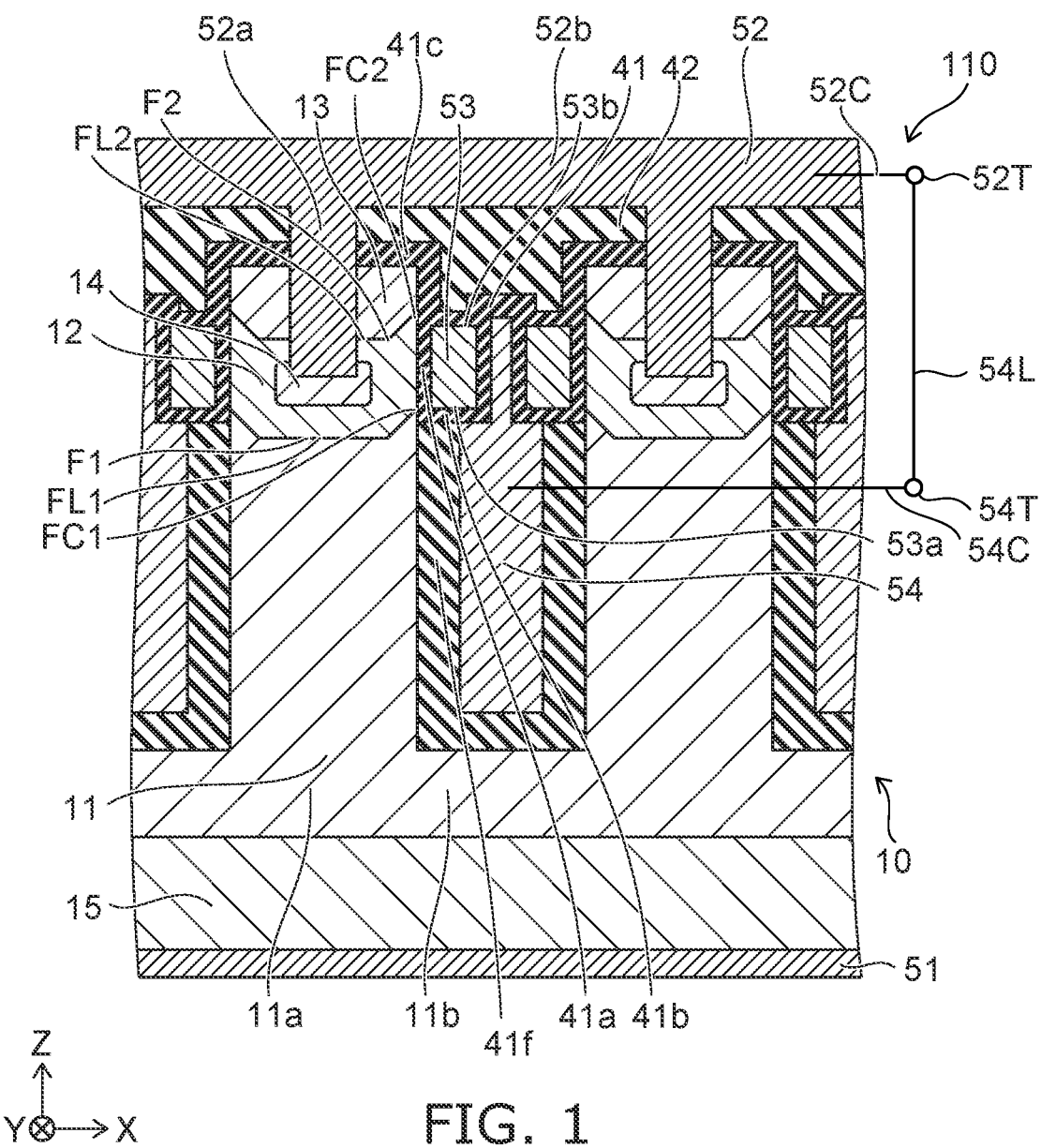
FIG. 1 is schematic cross-sectional view illustrating a semiconductor device according to a first embodiment.

According to one embodiment, a semiconductor device includes a first conductive member, a semiconductor member, a second conductive member, a third conductive member, and a first insulating member. The semiconductor member includes a first semiconductor region provided on the first conductive member, the first semiconductor region being of a first conductivity type, a second semiconductor region provided on a portion of the first semiconductor region, the second semiconductor region being of a second conductivity type, and a third semiconductor region provided on the second semiconductor region, the third semiconductor region being of the first conductivity type. An impurity concentration of the first conductivity type in the third semiconductor region is greater than an impurity concentration of the first conductivity type in the first semiconductor region. The second conductive member includes a first conductive portion electrically connected to the second and third semiconductor regions. The third conductive member is provided on an other portion of the first semiconductor region. A second direction from the second semiconductor region toward the third conductive member crosses a first direction from the first conductive member toward the first semiconductor region. At least a portion of the first insulating member is between the semiconductor member and the third conductive member. The at least a portion of the first insulating member electrically insulates between the semiconductor member and the third conductive member. The second semiconductor region includes a first surface facing the portion of the first semiconductor region. The first surface includes a first contact portion contacting the first insulating member. A first distance along the first direction between the first conductive member and a lower end portion of the first surface is less than a second distance along the first direction between the first conductive member and the first contact portion. The third semiconductor region includes a second surface facing the second semiconductor region. The second surface includes a second contact portion contacting the first insulating member. A third distance along the first direction between the first conductive member and a lower end portion of the second surface is less than a fourth distance along the first direction between the first conductive member and the second contact portion.

According to one embodiment, a semiconductor device includes a first conductive member, a semiconductor member, a second conductive member, a third conductive member, and a first insulating member. The semiconductor member includes a first semiconductor region provided on the first conductive member, the first semiconductor region being of a first conductivity type, a second semiconductor region provided on a portion of the first semiconductor region, the second semiconductor region being of a second conductivity type, and a third semiconductor region provided on the second semiconductor region, the third semiconductor region being of the first conductivity type. An impurity concentration of the first conductivity type in the third semiconductor region is greater than an impurity concentration of the first conductivity type in the first semiconductor region. The second conductive member includes a first conductive portion electrically connected to the second and third semiconductor regions. The third conductive member is provided on an other portion of the first semiconductor region. A second direction from the second semiconductor region toward the third conductive member crosses a first direction from the first conductive member toward the first semiconductor region. At least a portion of the first insulating member is between the semiconductor member and the third conductive member. The at least a portion of the first insulating member electrically insulates between the semiconductor member and the third conductive member. The first insulating member includes an upper insulating region provided on the third semiconductor region. An upper surface of the upper insulating region includes a protruding portion provided at an end portion in the second direction of the upper surface of the upper insulating region.

According to one embodiment, a method for manufacturing a semiconductor device is disclosed. The method can include preparing a structure body. The structure body includes a semiconductor member including a first semiconductor region of a first conductivity type, a first insulating member including an upper insulating region provided on a portion of the first semiconductor region, and two conductive members. A first direction from the portion of the first semiconductor region toward the upper insulating region crosses a second direction from one of the two conductive members toward the other one of the two conductive members. The portion of the first semiconductor region is between the two conductive members in the second direction. An upper surface of the upper insulating region includes a protruding portion provided at an end portion in the second direction of the upper surface of the upper insulating region. The method can include forming a second semiconductor region of a second conductivity type by introducing an impurity of the second conductivity type into the portion of the semiconductor member via the upper insulating region. In addition, the method can include forming a third semiconductor region of the first conductivity type by introducing an impurity of the first conductivity type into a portion of the second semiconductor region via the upper insulating region.

Various embodiments are described below with reference to the accompanying drawings.

The drawings are schematic and conceptual; and the relationships between the thickness and width of portions, the proportions of sizes among portions, etc., are not necessarily the same as the actual values. The dimensions and proportions may be illustrated differently among drawings, even for identical portions.

In the specification and drawings, components similar to those described previously or illustrated in an antecedent drawing are marked with like reference numerals, and a detailed description is omitted as appropriate.

First Embodiment

Figure 2:
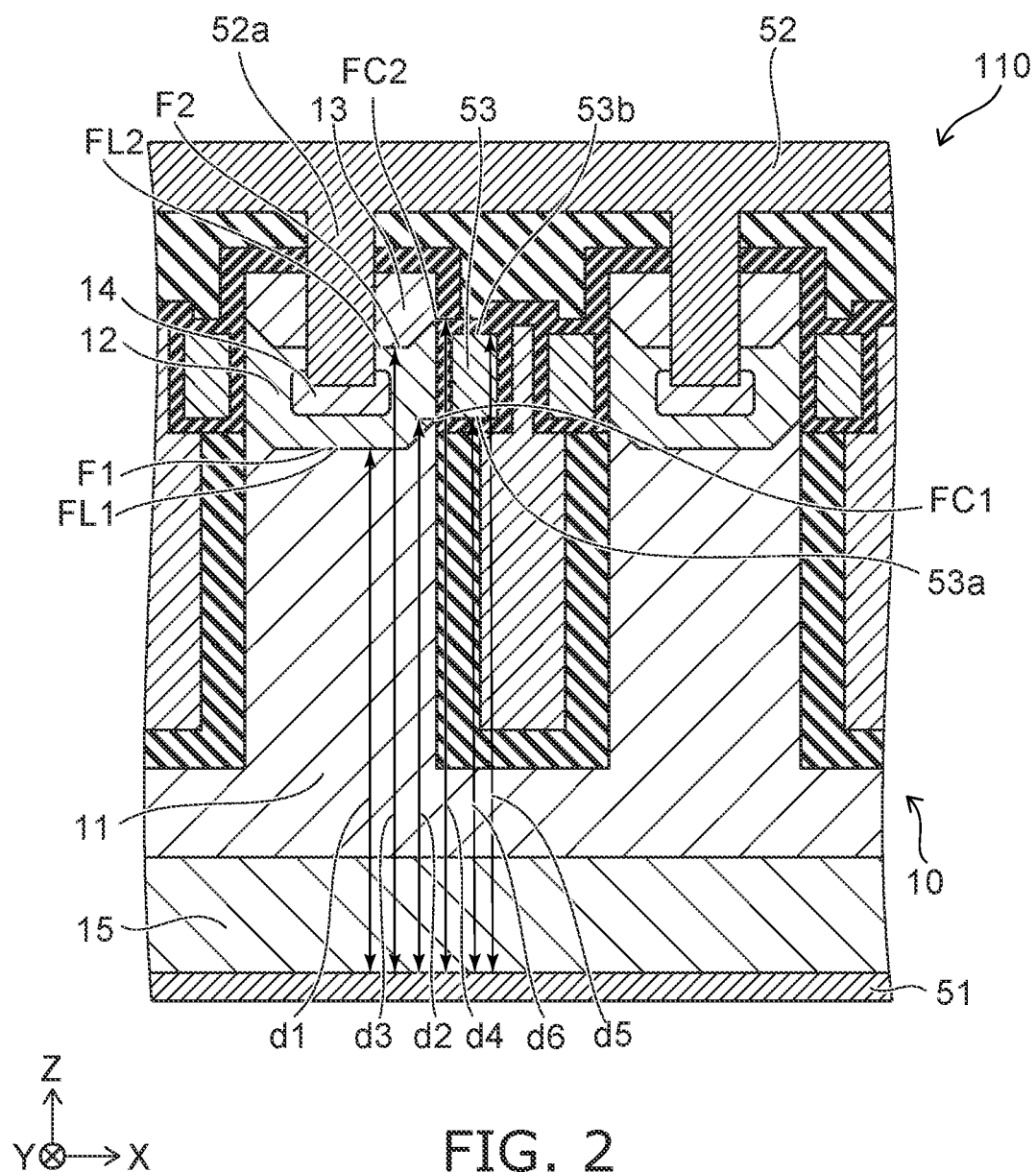
FIG. 2 is schematic cross-sectional view illustrating the semiconductor device according to the first embodiment.

FIGS. 1 and 2 are schematic cross-sectional views illustrating a semiconductor device according to a first embodiment.

As shown in FIG. 1, the semiconductor device 110 according to the embodiment includes a first conductive member 51, a second conductive member 52, a third conductive member 53, a semiconductor member 10, and a first insulating member 41.

The semiconductor member 10 includes a first semiconductor region 11, a second semiconductor region 12, and a third semiconductor region 13. As described below, the semiconductor member 10 may include a fourth semiconductor region 14 and a fifth semiconductor region 15.

The first semiconductor region 11 is located on the first conductive member 51. The first semiconductor region 11 is of a first conductivity type. The second semiconductor region 12 is located on a portion 11a of the first semiconductor region 11. The second semiconductor region 12 is of a second conductivity type. The third semiconductor region 13 is located on the second semiconductor region 12. The third semiconductor region 13 is of the first conductivity type.

For example, the first conductivity type is an n-type; and the second conductivity type is a p-type. The first conductivity type may be the p-type; and the second conductivity type may be the n-type. Hereinbelow, the first conductivity type is taken to be the n-type; and the second conductivity type is taken to be the p-type.

The impurity concentration of the first conductivity type in the third semiconductor region 13 is greater than the impurity concentration of the first conductivity type in the first semiconductor region 11. The first semiconductor region 11 is, for example, an n-layer (including an n$^-$-layer). For example, the third semiconductor region 13 is an n$^+$-layer.

The second conductive member 52 includes a first conductive portion 52a. The first conductive portion 52a is electrically connected to the second and third semiconductor regions 12 and 13. The third conductive member 53 is located on another portion 11b of the first semiconductor region 11.

The direction from the first conductive member 51 toward the first semiconductor region 11 is taken as a first direction. The direction from the portion 11a of the first semiconductor region 11 toward the third semiconductor region 13 is along the first direction. The first direction is taken as a Z-axis direction. One direction perpendicular to the Z-axis direction is taken as an X-axis direction. A direction perpendicular to the Z-axis direction and the X-axis direction is taken as a Y-axis direction.

A second direction from the second semiconductor region 12 toward the third conductive member 53 crosses the first direction. The second direction is, for example, the X-axis direction.

At least a portion of the first insulating member 41 is between the semiconductor member 10 and the third conductive member 53. The at least a portion of the first insulating member 41 electrically insulates between the semiconductor member 10 and the third conductive member 53. For example, the first insulating member 41 includes a first insulating region 41a and a second insulating region 41b. The first insulating region 41a is between the second semiconductor region 12 and the third conductive member 53 in the second direction (the X-axis direction). The second insulating region 41b is between the third conductive member 53 and the other portion 11b of the first semiconductor region 11 in the first direction (the Z-axis direction).

For example, the current that flows between the first conductive member 51 and the second conductive member 52 can be controlled by the potential of the third conductive member 53. The first conductive member 51 is, for example, a drain electrode. The second conductive member 52 is, for example, a source electrode. The third conductive member 53 is, for example, a gate electrode. For example, the first insulating region 41a of the first insulating member 41 functions as a gate insulating film. The semiconductor device 110 is, for example, a transistor.

As shown in FIG. 1, the semiconductor device 110 may include the fourth semiconductor region 14. The fourth semiconductor region 14 is of the second conductivity type (e.g., the p-type). At least a portion of the fourth semiconductor region 14 is between the first conductive portion 52a and a portion of the second semiconductor region 12 in the first direction (the Z-axis direction). The impurity concentration of the second conductivity type in the fourth semiconductor region 14 is greater than the impurity concentration of the second conductivity type in the second semiconductor region 12. The second semiconductor region 12 is, for example, a p-layer. The fourth semiconductor region 14 is, for example, a p+-layer, By providing the fourth semiconductor region 14, for example, the potential of the second semiconductor region 12 is stabilized.

As shown in FIG. 1, the semiconductor device 110 may further include the fifth semiconductor region 15 of the first conductivity type. The fifth semiconductor region 15 is between the first conductive member 51 and the first semiconductor region 11 in the first direction (the Z-axis direction). The impurity concentration of the first conductivity type in the fifth semiconductor region 15 is greater than the impurity concentration of the first conductivity type in the first semiconductor region 11. The first semiconductor region 11 is, for example, an n-layer. The fifth semiconductor region 15 is, for example, an n+-layer. By providing the fifth semiconductor region 15, for example, a low contact resistance of the first conductive member 51 is obtained. For example, a low on-resistance is obtained.

As described above, the impurity concentration of the first conductivity type in the third semiconductor region 13 is greater than the impurity concentration of the first conductivity type in the first semiconductor region 11. A low contact resistance of the second conductive member 52 is obtained. For example, a low on-resistance is obtained.

The second semiconductor region 12 is, for example, a base layer. The third semiconductor region 13 is, for example, a source layer. The portion 11a of the first semiconductor region 11 is a drift layer.

As shown in FIG. 1, the second semiconductor region 12 includes a first surface F1. The first surface F1 faces the portion 11a of the first semiconductor region 11. The first surface F1 includes a first contact portion FC1 that contacts the first insulating member 41. A lower end portion FL1 of the first surface F1 is lower than the first contact portion FC1.

The third semiconductor region 13 includes a second surface F2. The second surface F2 faces the second semiconductor region 12. The second surface F2 includes a second contact portion FC2 that contacts the first insulating member 41. A lower end portion FL2 of the second surface F2 is lower than the second contact portion FC2.

As shown in FIG. 2, the distance along the first direction (the Z-axis direction) between the first conductive member 51 and the lower end portion FL1 of the first surface F1 is taken as a first distance d1. The distance along the first direction between the first conductive member 51 and the first contact portion FC1 is taken as a second distance d2. According to the embodiment, the first distance d1 is less than the second distance d2.

As shown in FIG. 2, the distance along the first direction (the Z-axis direction) between the first conductive member 51 and the lower end portion FL2 of the second surface F2 is taken as a third distance d3. The distance along the first direction between the first conductive member 51 and the second contact portion FC2 is taken as a fourth distance d4. According to the embodiment, the third distance d3 is less than the fourth distance d4.

For example, the first surface F1 is convex. The second surface F2 is convex. In one example, the second surface F2 is curved to be convex to conform to the first surface F1.

By such a configuration, a semiconductor device can be provided in which the characteristics can be improved.

Figure 3:
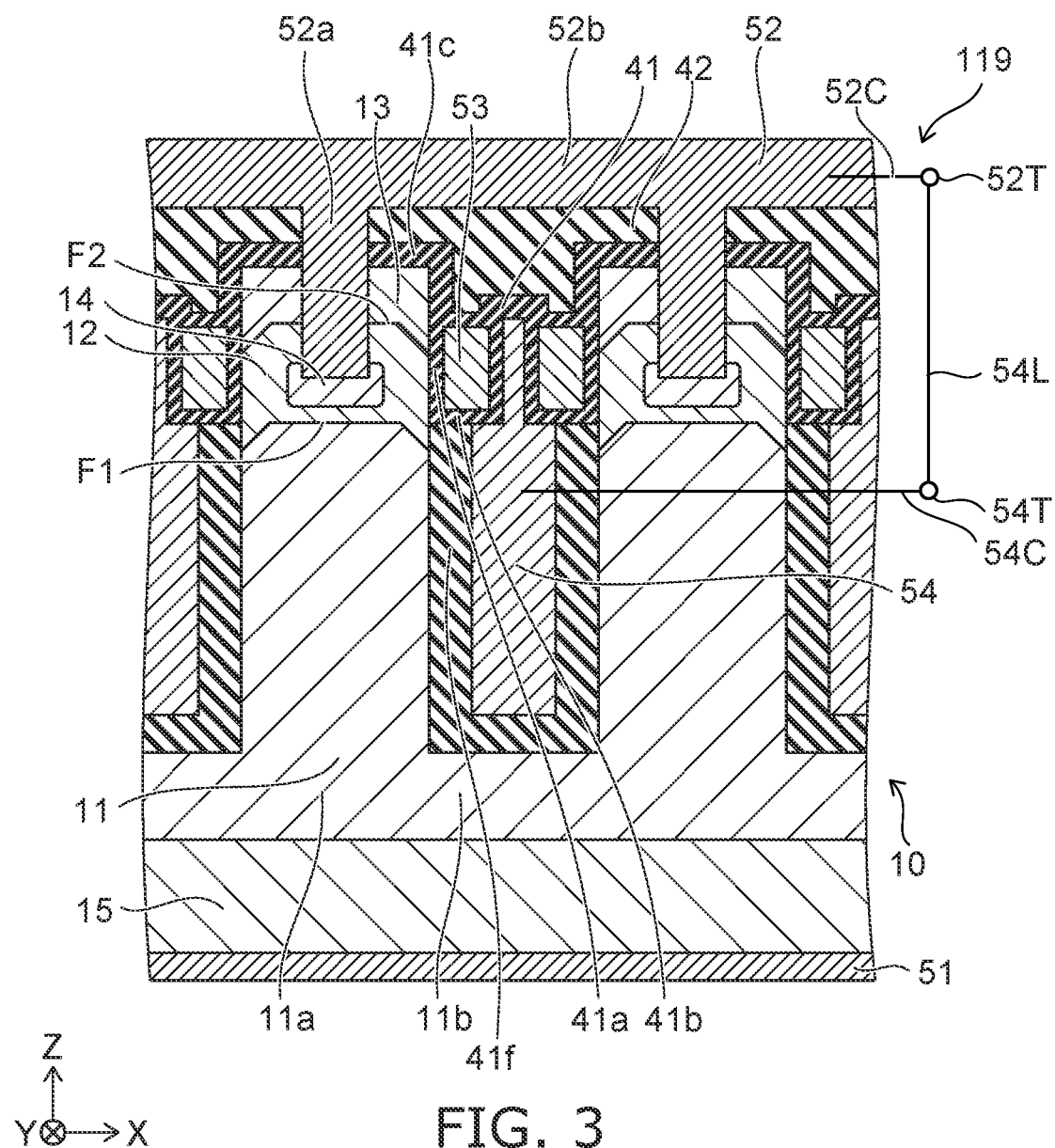
FIG. 3 is a schematic cross-sectional view illustrating a semiconductor device according to a reference example.

FIG. 3 is a schematic cross-sectional view illustrating a semiconductor device according to a reference example.

In the semiconductor device 119 of the reference example as shown in FIG. 3, the first surface F1 is concave; and the second surface F2 is concave. In such a semiconductor device 119, for example, the end portion in the X-axis direction (the portion at the first insulating member 41 side) of the second semiconductor region 12 extends to be lower than the X-axis direction central portion of the second semiconductor region 12. As a result, the parasitic resistance easily increases. Therefore, the on-resistance is easily increased. There is a tendency for the channel length to easily lengthen and for the on-resistance Ron·A to increase. Also, in the semiconductor device 119, the lower portion (the portion between the first semiconductor region 11 and the fourth semiconductor region 14) of the second semiconductor region 12 (e.g., the base layer) is thin. Therefore, punch-through easily occurs.

Conversely, according to the embodiment, the second surface F2 is convex. The parasitic resistance is suppressed thereby, and a low on-resistance is easily obtained. The channel length can be reduced, and a low on-resistance Ron·A is easily obtained. Because the first surface F1 is convex according to the embodiment, for example, a thick lower portion (the portion between the first semiconductor region 11 and the fourth semiconductor region 14) of the second semiconductor region 12 is easily maintained. Punch-through is suppressed thereby.

As shown in FIG. 1, for example, the lower end portion FL2 of the second surface F2 is lower than an upper end portion 53b of the third conductive member 53. For example, the second contact portion FC2 is higher than the upper end portion 53b of the third conductive member 53. For example, the lower end portion FL1 of the first surface F1 is lower than a lower end portion 53a of the third conductive member 53. More stable characteristics are obtained by such a configuration. In the example, the height of the first contact portion FC1 is substantially equal to the height of the lower end portion 53a of the third conductive member 53. As shown in FIG. 2, for example, the third distance d3 is less than a distance d5 along the first direction between the first conductive member 51 and the upper end portion 53b of the third conductive member 53. For example, the fourth distance d4 is greater than the distance d5 along the first direction between the first conductive member 51 and the upper end portion 53b of the third conductive member 53. For example, the first distance d1 is less than a distance d6 along the first direction between the first conductive member 51 and the lower end portion 53a of the third conductive member 53. In the example, the second distance d2 is substantially equal to the distance d6 along the first direction between the first conductive member 51 and the lower end portion 53a of the third conductive member 53.

As shown in FIG. 1, the semiconductor device 110 may further include a second insulating member 42. In the example, the second conductive member 52 further includes a second conductive portion 52b. The first insulating member 41 includes an upper insulating region 41c. The upper insulating region 41c is located on the third semiconductor region 13. The second conductive portion 52b is on the upper insulating region 41c. A portion of the second insulating member 42 is between the upper insulating region 41c and a portion of the second conductive portion 52b in the first direction (the Z-axis direction).

The boundary between the first insulating member 41 and the second insulating member 42 may be distinct or indistinct.

As shown in FIG. 1, the semiconductor device 110 may further include a fourth conductive member 54. At least a portion of the fourth conductive member 54 is between the third conductive member 53 and the other portion 11b of the first semiconductor region 11. The position in the first direction (the Z-axis direction) of at least a portion of the fourth conductive member 54 is between the position in the first direction of the other portion 11b of the first semiconductor region 11 and the position in the first direction of the third conductive member 53. A portion 41f of the first insulating member 41 is between the semiconductor member 10 and the fourth conductive member 54. The portion 41f of the first insulating member 41 electrically insulates between the semiconductor member 10 and the fourth conductive member 54. The boundary between the portion 41f of the first insulating member 41 and the first insulating region 41a may be distinct or indistinct. The boundary between the portion 41f of the first insulating member 41 and the second insulating region 41b may be distinct or indistinct.

In one example, the fourth conductive member 54 is electrically connected to one of the second conductive member 52 or the third conductive member 53. Or, the fourth conductive member 54 is electrically connectable to one of the second conductive member 52 or the third conductive member 53.

In the example, the fourth conductive member 54 is electrically connected to the second conductive member 52. For example, the semiconductor device 110 may further include a connection member 54L. The connection member 54L electrically connects the fourth conductive member 54 and one of the second conductive member 52 or the third conductive member 53.

As shown in FIG. 1, the semiconductor device 110 may include a terminal 54T that is electrically connected to the fourth conductive member 54. For example, the fourth conductive member 54 and the terminal 54T are electrically connected by a connection member 54C. The semiconductor device 110 may include a terminal 52T that is electrically connected to the second conductive member 52. For example, the second conductive member 52 and the terminal 52T are connected by a connection member 52C. The terminal 54T and the terminal 52T may be electrically connected by the connection member 54L. When the terminal 54T is provided, the connection member 54L may not be included in the semiconductor device 110.

For example, the fourth conductive member 54 functions as a field plate. By providing the fourth conductive member 54, the concentration of the electric field can be suppressed. For example, a high breakdown voltage is obtained.

An example of a method for manufacturing the semiconductor device 110 will now be described.

FIGS. 4A to 4D are schematic cross-sectional views illustrating the method for manufacturing the semiconductor device according to the embodiment.

Figure 4A:
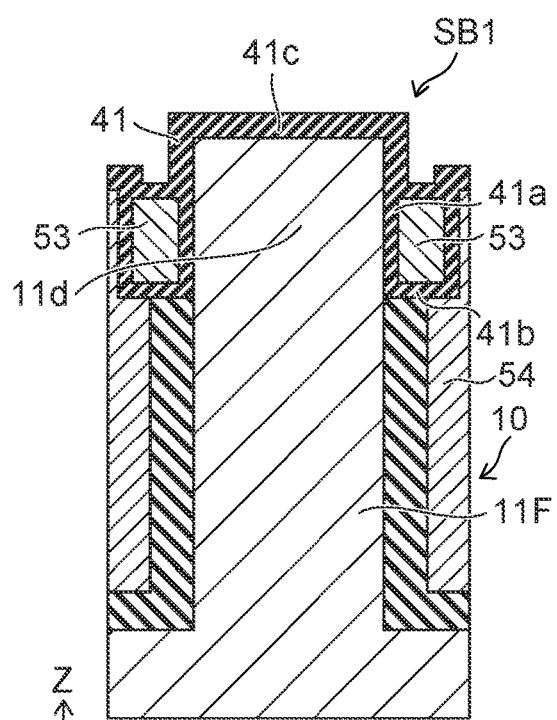
FIGS. 4A to 4D are schematic cross-sectional views illustrating a method for manufacturing the semiconductor device according to the embodiment.

A structure body SB1 is prepared as shown in FIG. 4A. The structure body SB1 includes the semiconductor member 10, the first insulating member 41, and two conductive members (e.g., the third conductive members 53). The semiconductor member 10 includes a first semiconductor region 11F of the first conductivity type. The first insulating member 41 includes the upper insulating region 41c. The upper insulating region 41c is located on a portion 11d of the first semiconductor region 11F. The direction from the portion 11d of the first semiconductor region 11F toward the upper insulating region 41c is taken as the first direction. The first direction is, for example, the Z-axis direction. The direction from one of the two conductive members (the third conductive members 53) toward the other one of the two conductive members (the third conductive members 53) is taken as the second direction. The first direction crosses the second direction. The second direction is, for example, the X-axis direction. The portion 11d of the first semiconductor region 11F is between the two conductive members (the third conductive members 53) in the second direction (the X-axis direction).

Figure 4B:
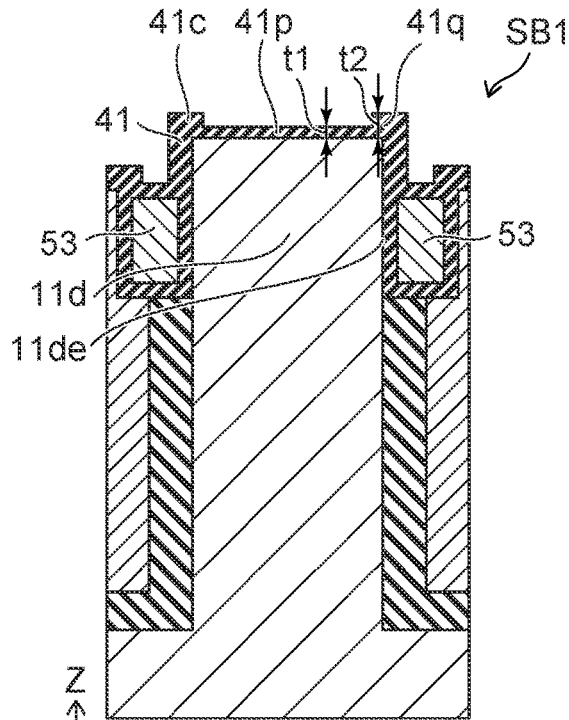

As shown in FIG. 4B, the upper insulating region 41c of the first insulating member 41 includes a first insulating portion 41p and a second insulating portion 41q. The first insulating portion 41p is on the second-direction (X-axis direction) central portion of the portion 11d of the first semiconductor region 11F. The second insulating portion 41q is on an end portion 11de in the second direction (the X-axis direction) of the portion 11d of the first semiconductor region 11F. The end portion 11de is at the X-axis direction end of a portion (the portion 11d) of the first semiconductor region 11F between the two conductive members (e.g., the third conductive members 53). The end portion 11de includes a portion that contacts the first insulating member 41.

As shown in FIG. 4B, the thickness along the first direction (the Z-axis direction) of the first insulating portion 41p is taken as a first thickness t1. The thickness along the first direction of the second insulating portion 41q is taken as a second thickness t2. The first thickness t1 is less than the second thickness t2.

For example, such a structure can be formed by forming a mask that has an opening on the first insulating member 41 in FIG. 4A and by removing a portion of the first insulating member 41 via the opening.

Figure 4C:
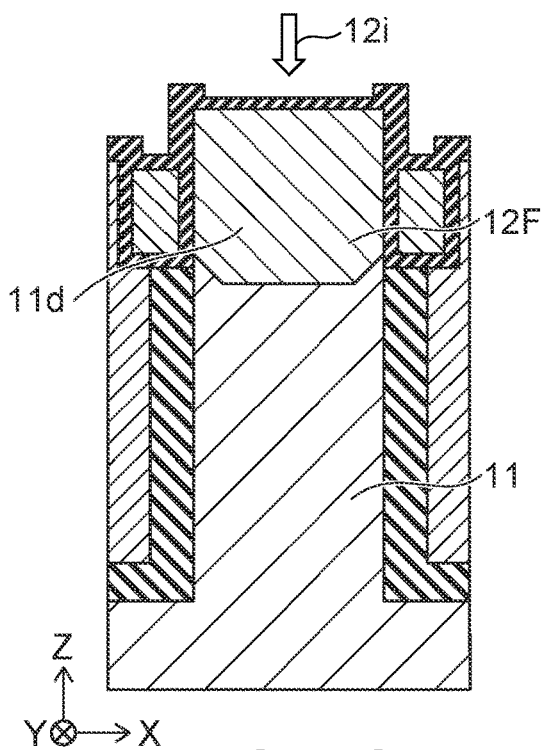

As shown in FIG. 4C, a second semiconductor region 12F of the second conductivity type is formed by introducing an impurity 12i of the second conductivity type into the portion 11d of the first semiconductor region 11 via the upper insulating region 41c. For example, the introduction of the impurity 12i is performed by implantation.

Figure 4D:
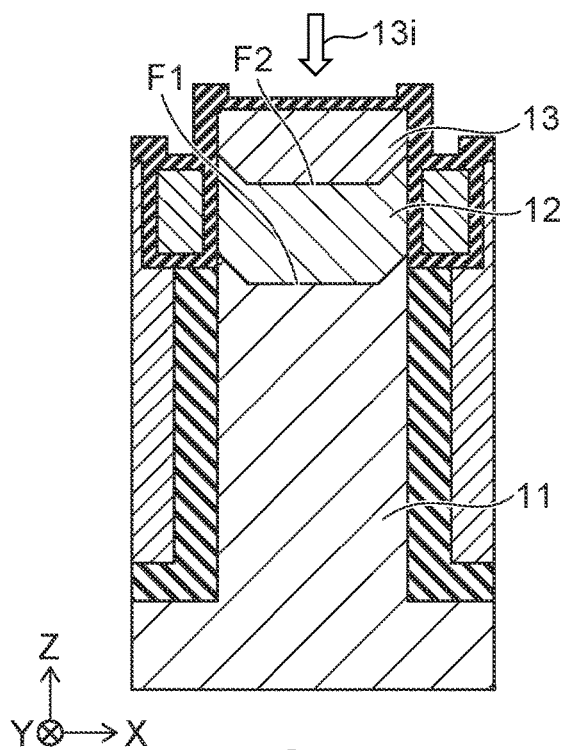

As shown in FIG. 4D, the third semiconductor region 13 of the first conductivity type is formed by introducing an impurity 13i of the first conductivity type into a portion of the second semiconductor region 12F via the upper insulating region 41c. For example, the introduction of the impurity 13i is performed by implantation. The region into which the impurity 13i is not introduced is used to form the second semiconductor region 12.

In the manufacturing method described above, the upper insulating region 41c includes the first insulating portion 41p and the second insulating portion 41q that have mutually-different thicknesses. For example, the depth of the impurity introduced to the region corresponding to the thick second insulating portion 41q is less than the depth of the impurity introduced to the region corresponding to the thin first insulating portion 41p. The convex first surface F1 and the convex second surface F2 (referring to FIG. 4D) are stably and easily obtained thereby.

Subsequently, the semiconductor device 110 is obtained by forming the second conductive member 52 and the first conductive member 51.

For example, the semiconductor device 119 of the reference example described above (referring to FIG. 3) is formed by introducing an impurity into the structure body SB1 used to form the first semiconductor region 11, the second semiconductor region 12, and the third semiconductor region 13 (referring to FIG. 4A). In the reference example, the impurity is introduced to the configuration of FIG. 4A in which the thickness of the first insulating member 41 is uniform. In such a case, for example, the degree of the diffusion of the impurity that is introduced is dependent on the conditions of the ion implantation, the heat treatment conditions, etc., and easily changes according to the height (the depth) of the third conductive member 53

(e.g., the gate). Therefore, the concave first surface F1 and the concave second surface F2 illustrated in FIG. 3 easily occur. In such a case, the channel length changes, and is dependent on the height (the depth) of the third conductive member 53 (e.g., the gate); and the threshold voltage easily fluctuates.

Conversely, in the example of the manufacturing method according to the embodiment, for example, the concave first surface F1 and the concave second surface F2 can be more stably suppressed by introducing the impurity via the first insulating member 41 that includes the first insulating portion 41p and the second insulating portion 41q that have mutually-different thicknesses. For example, the convex first surface F1 and the convex second surface F2 are easily obtained. Or, a flat first surface F1 and a flat second surface F2 are easily obtained. For example, a stable threshold voltage is easily obtained thereby. For example, the change of the threshold voltage that is dependent on the height (the depth) of the third conductive member 53 (e.g., the gate) can be suppressed.

The manufacturing method described above is an example; according to the embodiment, the structure of the semiconductor device 110 may be obtained by another method. For example, the concave first surface F1 and the concave second surface F2 may be formed by using implantation to introduce an impurity with a particle flux having some level of spreading via the upper insulating region 41c having the configuration illustrated in FIG. 4A. As described below, a protruding portion may be provided in the end portion in the X-axis direction of the upper surface of the upper insulating region 41c.

Figure 5:
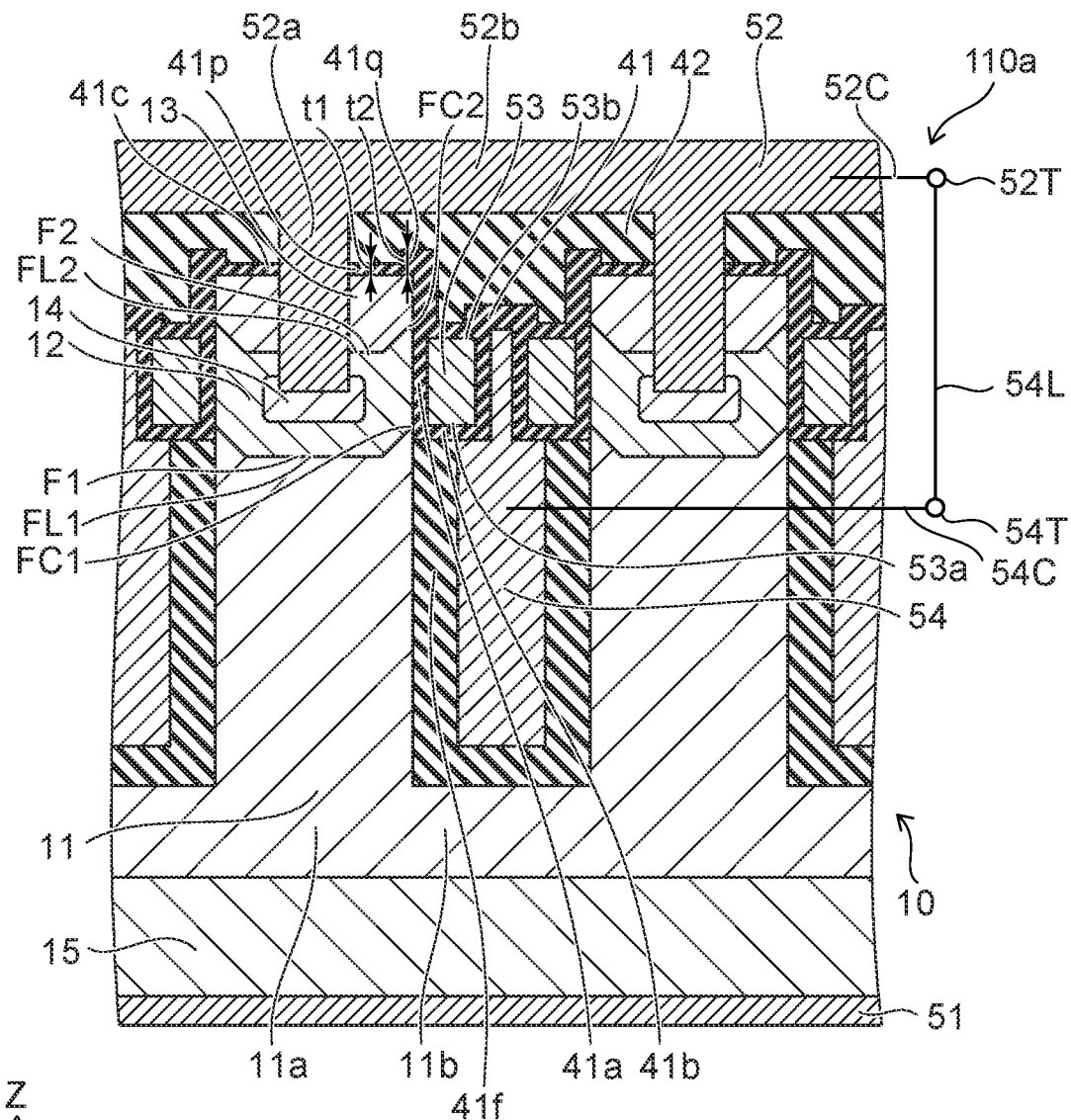
FIG. 5 is a schematic cross-sectional view illustrating a semiconductor device according to the first embodiment.

FIG. 5 is a schematic cross-sectional view illustrating a semiconductor device according to the first embodiment.

In the semiconductor device 110a according to the embodiment as shown in FIG. 5, the upper insulating region 41c of the first insulating member 41 includes the first insulating portion 41p and the second insulating portion 41q that have mutually-different thicknesses. Otherwise, the configuration of the semiconductor device 110a may be similar to the configuration of the semiconductor device 110.

In the semiconductor device 110a, for example, the upper insulating region 41c of the first insulating member 41 is provided on the third semiconductor region 13. The upper insulating region 41c includes the first insulating portion 41p and the second insulating portion 41q. The first insulating portion 41p is between the first conductive portion 52a and the second insulating portion 41q. The first thickness t1 along the first direction (the Z-axis direction) of the first insulating portion 41p is less than the second thickness t2 along the first direction of the second insulating portion 41q.

By introducing an impurity via the first insulating member 41 (the upper insulating region 41c) that includes such a first insulating portion 41p and such a second insulating portion 41q, the shape of the region into which the impurity is introduced can be more stably controlled. As described below, a protruding portion may be provided in the end portion in the X-axis direction of the upper surface of the upper insulating region 41c.

Figure 6:
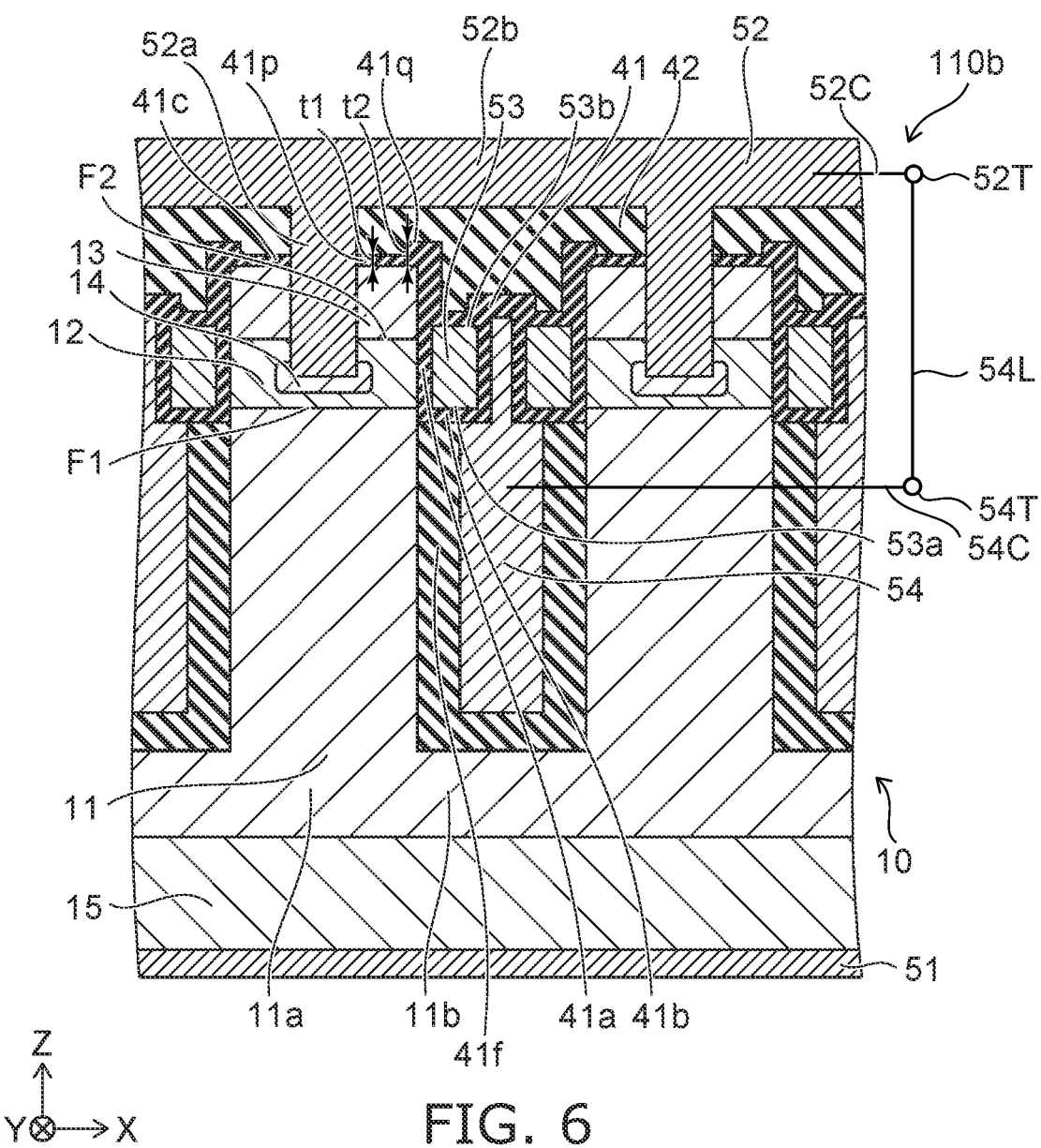
FIG. 6 is a schematic cross-sectional view illustrating a semiconductor device according to the first embodiment.

FIG. 6 is a schematic cross-sectional view illustrating a semiconductor device according to the first embodiment.

In the semiconductor device 110b according to the embodiment as shown in FIG. 6, the upper insulating region 41c of the first insulating member 41 includes the first insulating portion 41p and the second insulating portion 41q that have mutually-different thicknesses. In the semiconductor device 110b, the first surface F1 and the second surface F2 are substantially parallel to the X-Y plane. The first surface F1 and the second surface F2 are substantially flat. In the semiconductor device 110b, the first surface F1 and the second surface F2 are not concave; therefore, the parasitic resistance is suppressed, and a low on-resistance is easily obtained. A low on-resistance Ron·A is easily obtained.

Figure 7:
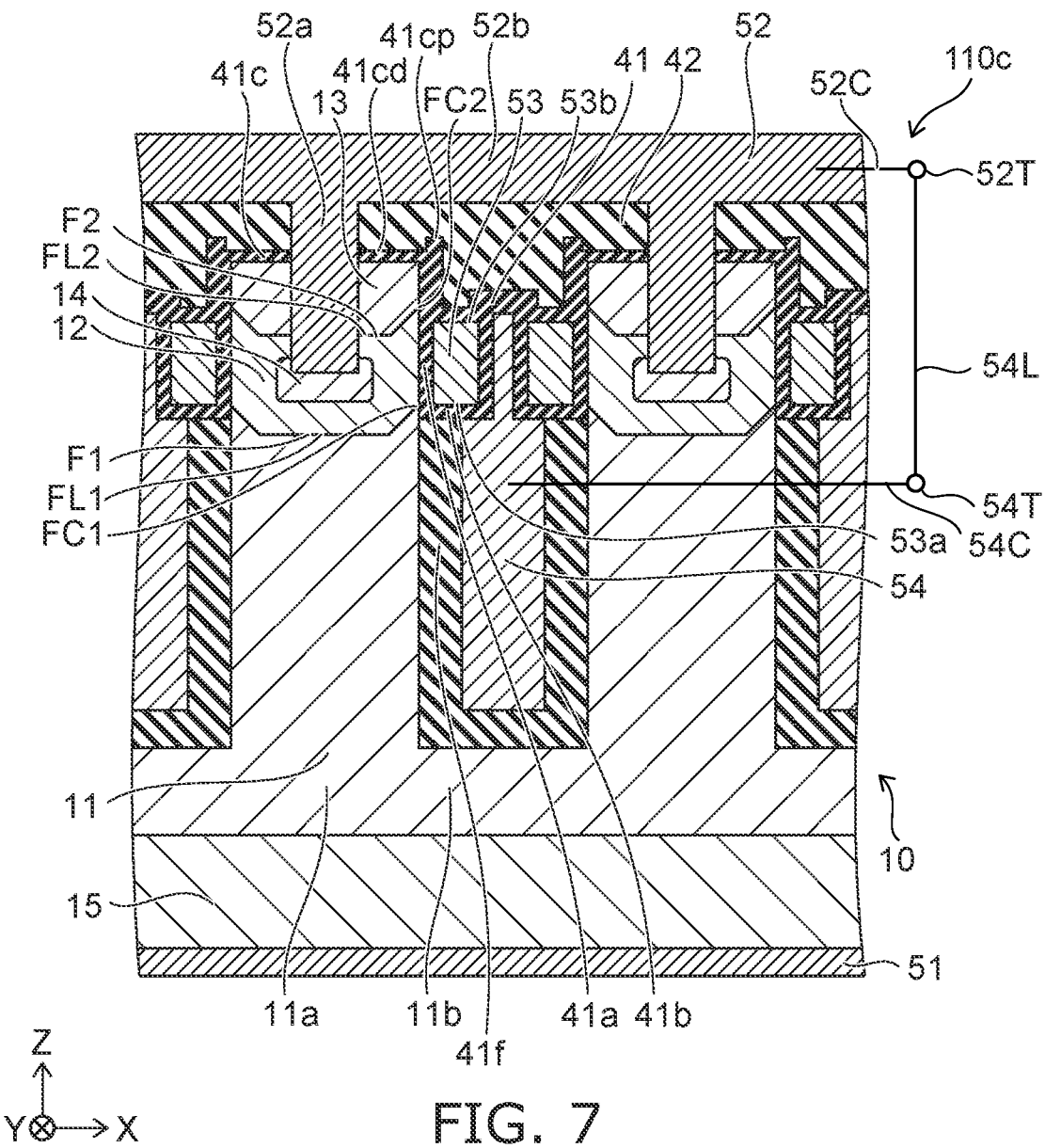
FIG. 7 is a schematic cross-sectional view illustrating a semiconductor device according to the first embodiment.

FIG. 7 is a schematic cross-sectional view illustrating a semiconductor device according to the first embodiment.

In the semiconductor device 110c according to the embodiment as shown in FIG. 7 as well, the first insulating member 41 includes the upper insulating region 41c provided on the third semiconductor region 13. In the semiconductor device 110c, an upper surface 41cd of the upper insulating region 41c includes a protruding portion 41cp provided at the end portion in the second direction (the X-axis direction) of the upper surface 41cd of the upper insulating region 41c. Otherwise, the configuration of the semiconductor device 110c may be similar to that of the semiconductor device 110. In the semiconductor device 110c, for example, the shape of the region into which the impurity is introduced can be more stably controlled by introducing the impurity via the upper insulating region 41c that has a shape such as that described above. For example, the first surface F1 and the second surface F2 can be effectively prevented from being concave.

Figure 8:
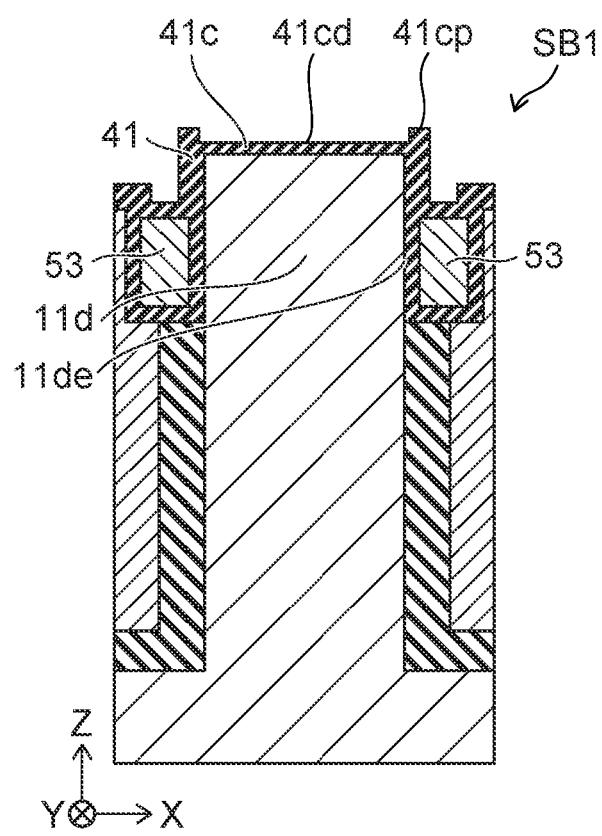
FIG. 8 is a schematic cross-sectional view illustrating a portion of the method for manufacturing the semiconductor device according to the embodiment.

FIG. 8 is a schematic cross-sectional view illustrating a portion of the method for manufacturing the semiconductor device according to the embodiment.

In the process corresponding to FIG. 4B as shown in FIG. 8, the upper surface 41cd of the upper insulating region 41c includes the protruding portion 41cp at the end portion in the second direction (the X-axis direction) of the upper surface 41cd of the upper insulating region 41c. As described with reference to FIGS. 4C and 4D, for example, the semiconductor device 110c is obtained by introducing the impurity via such an upper insulating region 41c. This introduction is performed by, for example, providing the particle flux of the impurity with some level of spreading when introducing the impurity.

Figure 9:
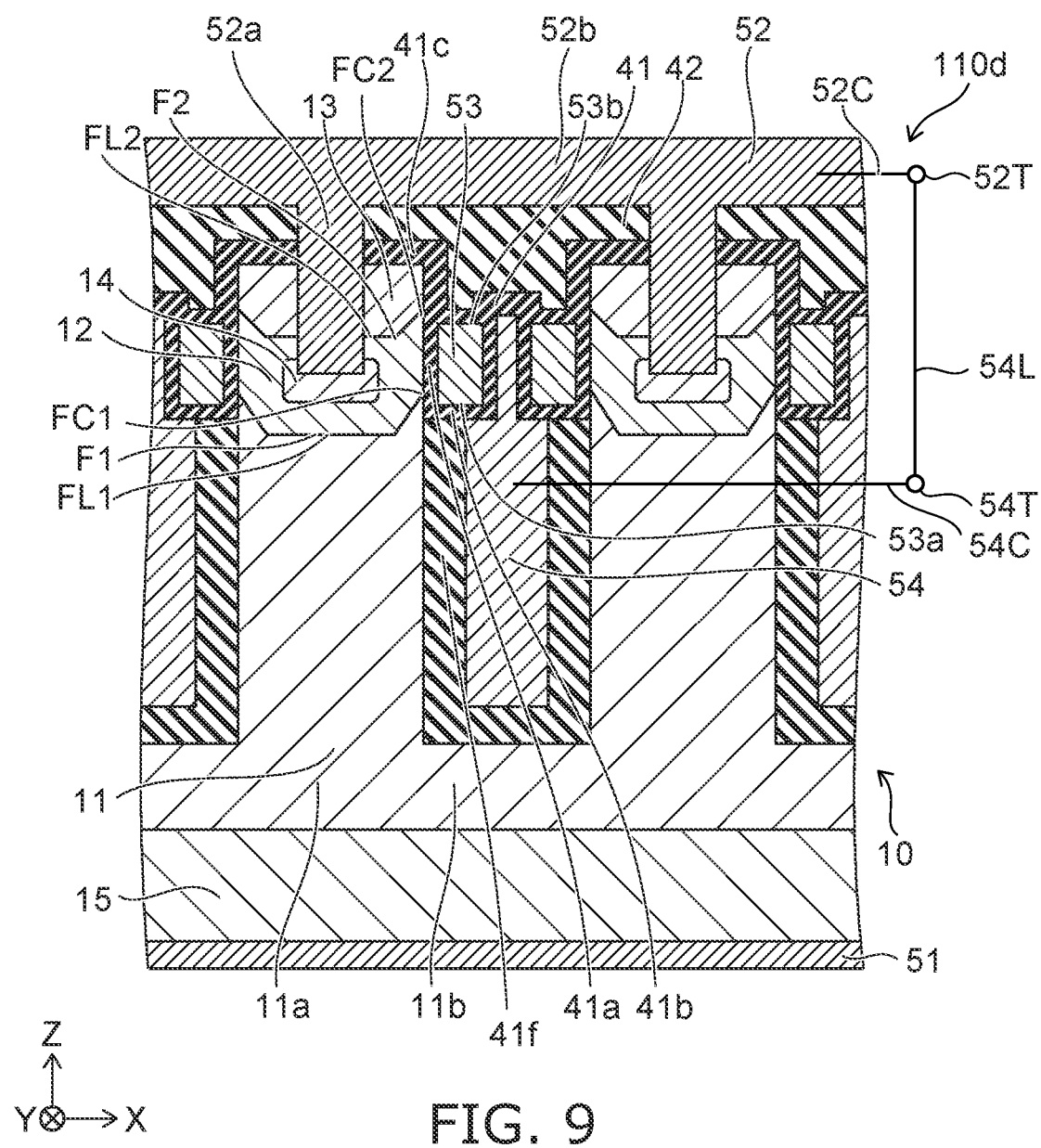
FIG. 9 is a schematic cross-sectional view illustrating a semiconductor device according to the first embodiment.

FIG. 9 is a schematic cross-sectional view illustrating a semiconductor device according to the first embodiment.

In the semiconductor device 110d according to the embodiment as shown in FIG. 9, the first contact portion FC1 is higher than the lower end portion 53a of the third conductive member 53. For example, the second distance d2 (referring to FIG. 2) is greater than the distance d6 (referring to FIG. 2). Otherwise, the configuration of the semiconductor device 110d may be similar to that of the semiconductor device 110. In the semiconductor device 110d as well, a semiconductor device can be provided in which the characteristics can be improved.

Figure 10:
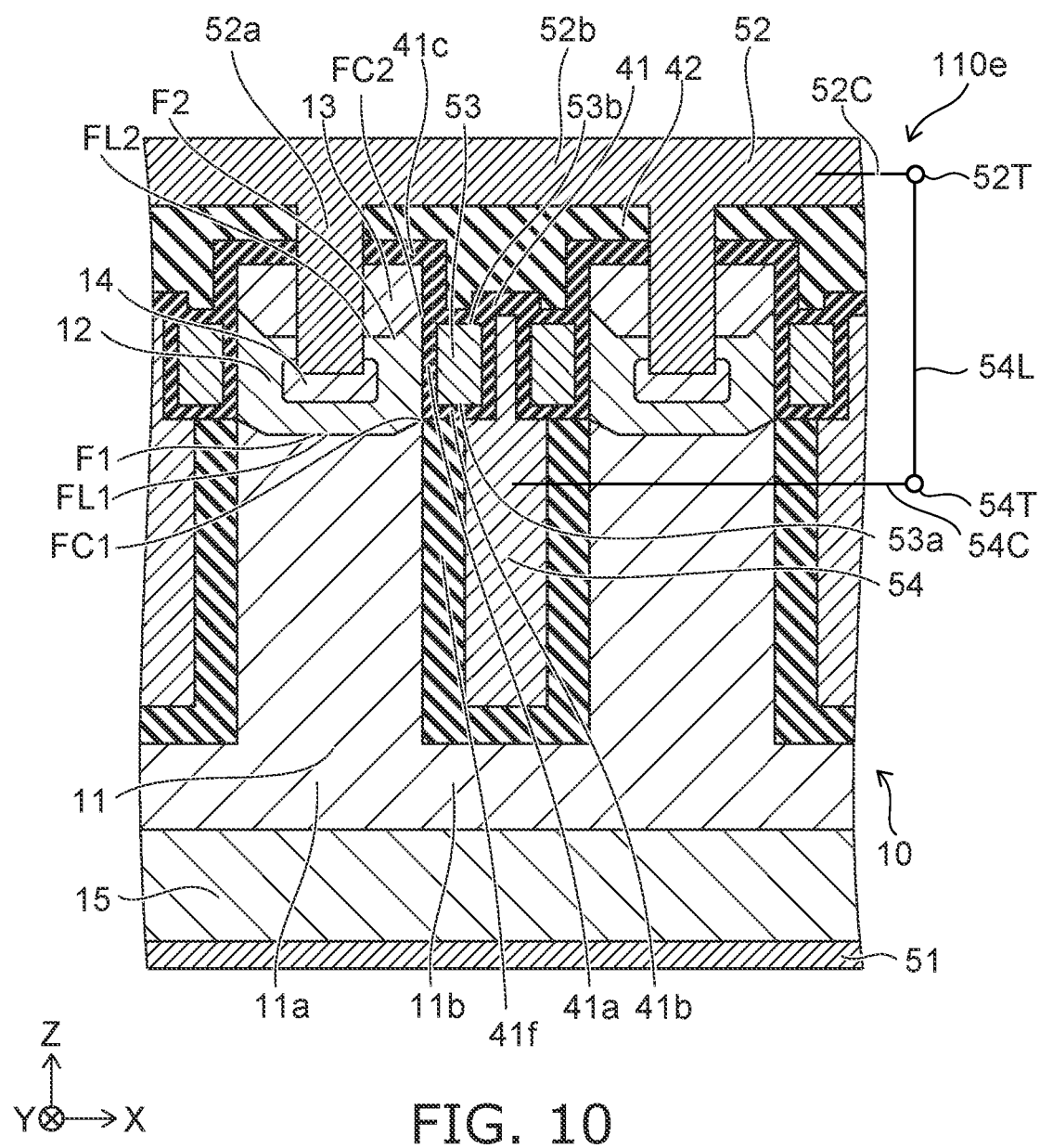
FIG. 10 is a schematic cross-sectional view illustrating a semiconductor device according to the first embodiment.

FIG. 10 is a schematic cross-sectional view illustrating a semiconductor device according to the first embodiment.

In the semiconductor device 110e according to the embodiment as shown in FIG. 10, the first contact portion FC1 is lower than the lower end portion 53a of the third conductive member 53. For example, the second distance d2 (referring to FIG. 2) is less than the distance d6 (referring to FIG. 2). Otherwise, the configuration of the semiconductor device 110e may be similar to that of the semiconductor device 110. In the semiconductor device 110e as well, a semiconductor device can be provided in which the characteristics can be improved.

Figure 11:
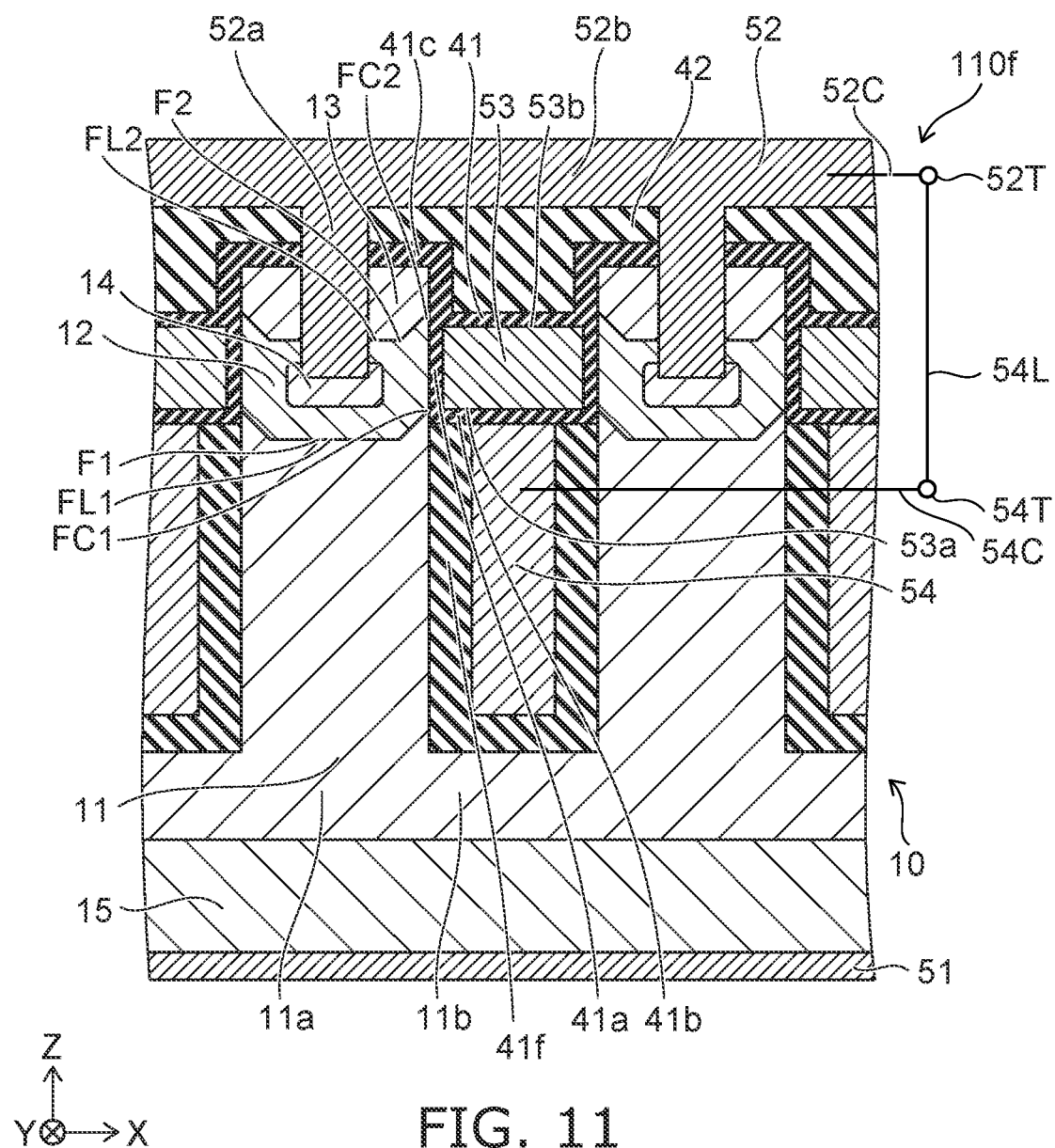
FIG. 11 is a schematic cross-sectional view illustrating a semiconductor device according to the first embodiment.

FIG. 11 is a schematic cross-sectional view illustrating a semiconductor device according to the first embodiment.

In the semiconductor device 110f according to the embodiment as shown in FIG. 11, the number of the third conductive members 53 provided between two first conductive portions 52a is one. Otherwise, the configuration of the semiconductor device 110f may be similar to that of the semiconductor device 110. In the semiconductor device 110f as a semiconductor device can be provided in which the characteristics can be improved.

Figure 12:
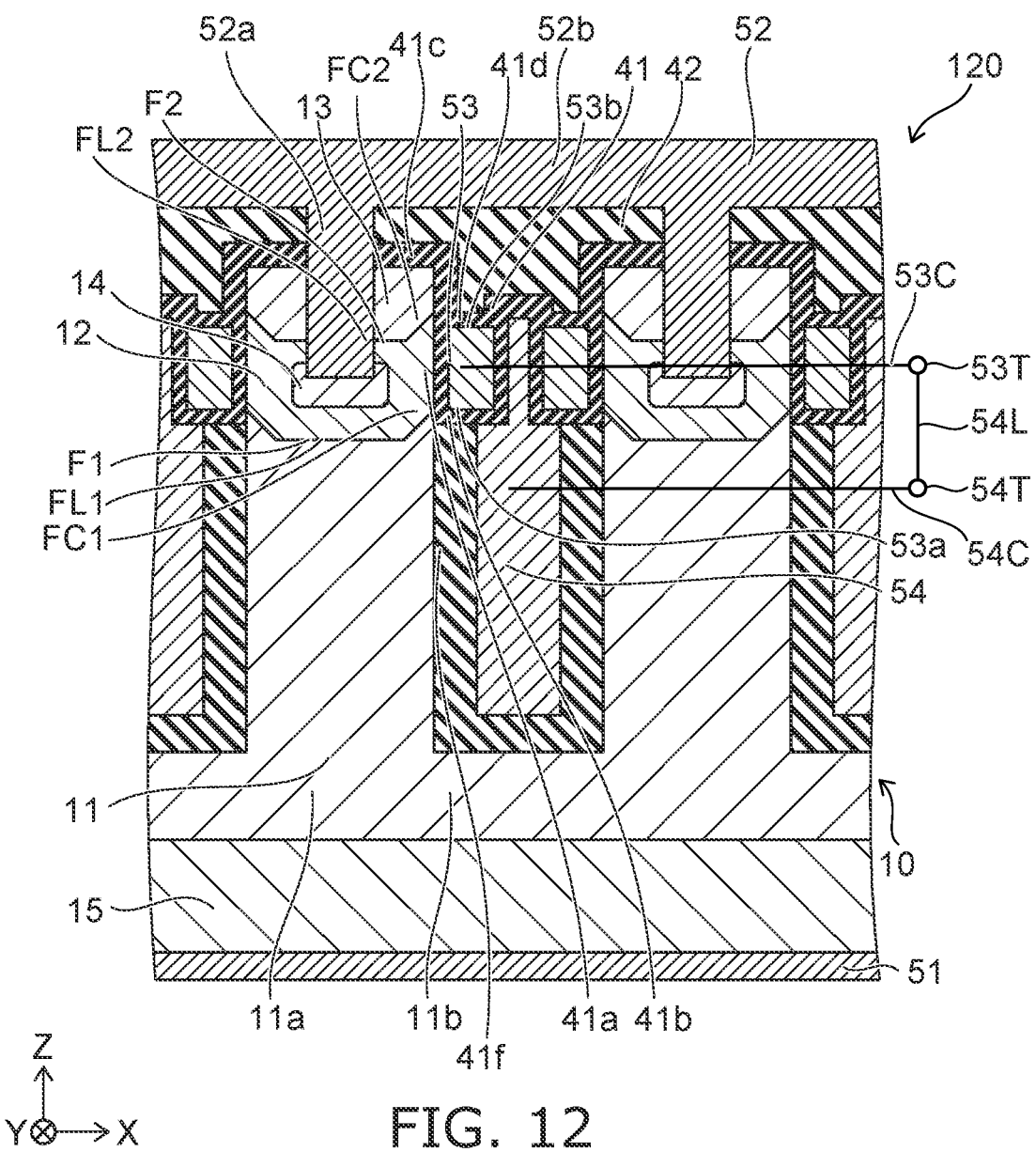
FIG. 12 is a schematic cross-sectional view illustrating a semiconductor device according to the first embodiment.
Figure 13:
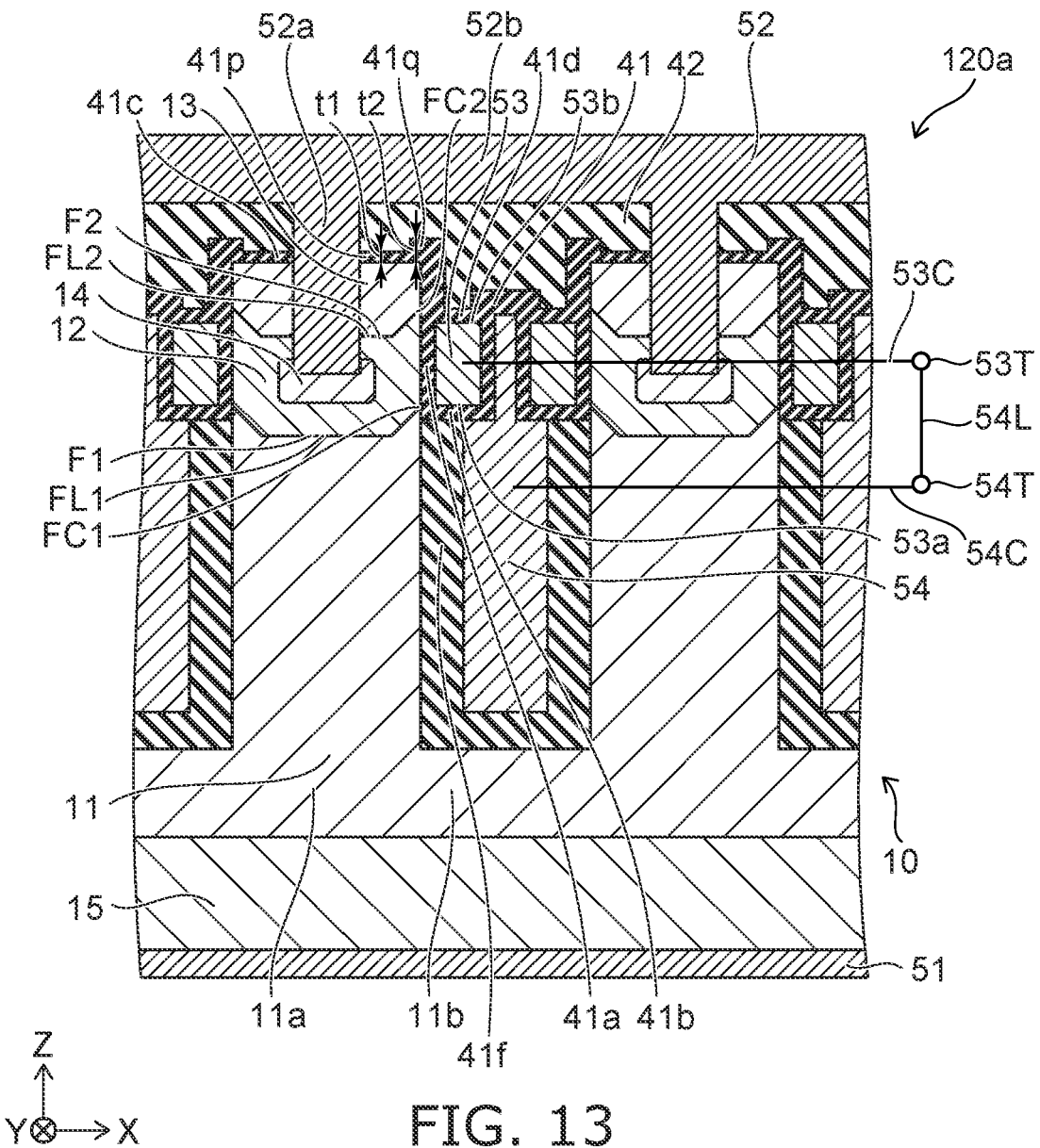
FIG. 13 is a schematic cross-sectional view illustrating a semiconductor device according to the first embodiment.
Figure 14:
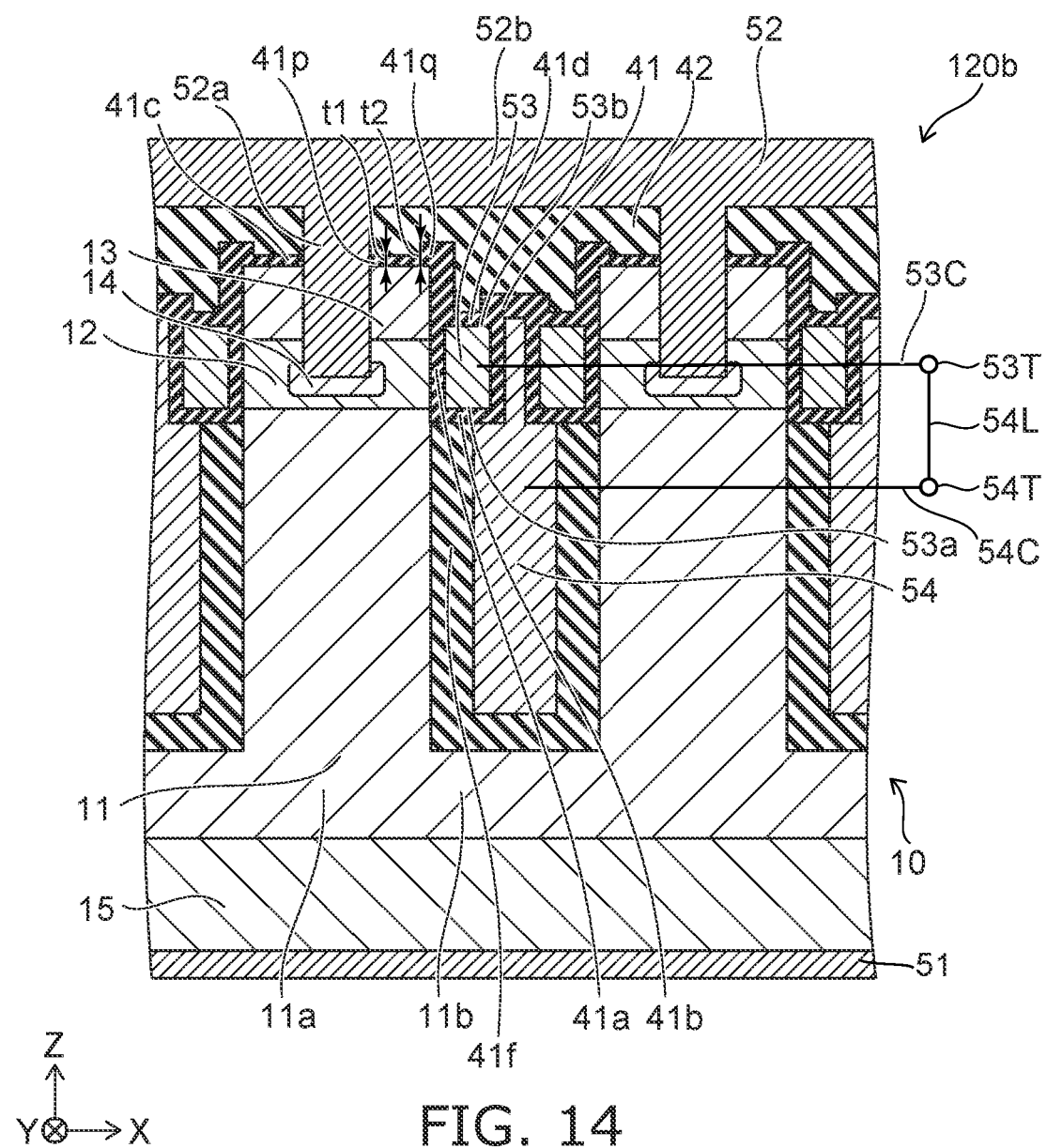
FIG. 14 is a schematic cross-sectional view illustrating a semiconductor device according to the first embodiment.

FIGS. 12 to 14 are schematic cross-sectional views illustrating semiconductor devices according to the first embodiment.

In semiconductor devices 120, 120a, and 120b according to the embodiment as shown in FIGS. 12 to 14, the fourth conductive member 54 is electrically connected to the third conductive member 53. Or, the fourth conductive member 54 is electrically connectable to the third conductive member 53.

For example, the fourth conductive member 54 is electrically connected to the third conductive member 53 by the connection member 54L. For example, the terminal 54T that is electrically connected to the fourth conductive member 54 is provided. A terminal 53T that is electrically connected to the third conductive member 53 is provided. For example, the third conductive member 53 and the terminal 53T are connected by a connection member 53C. The terminal 54T and the terminal 53T may be electrically connected by the connection member 54L. When the terminal 54T is provided, the connection member 54L may not be included in the semiconductor devices 120, 120a, and 120b. By providing the fourth conductive member 54, the concentration of the electric field can be suppressed. For example, a high breakdown voltage is obtained. According to the embodiment, the fourth conductive member 54 may be electrically connected to the third conductive member 53 in the cross sections illustrated in FIGS. 12 to 14.

Otherwise, the configurations of the semiconductor devices 120, 120a, and 120b may be similar to the configurations of the semiconductor devices 110 and 110a to 110f. According to the semiconductor devices 120, 120a, and 120b, a semiconductor device can be provided in which the characteristics can be improved.

According to the embodiment, the semiconductor member 10 includes, for example, silicon.

The impurity concentration of the first conductivity type (or the carrier concentration of the first conductivity type) in the first semiconductor region 11 is, for example, not less than $1 \times 10^{15}$ cm$^{-3}$ and not more than $5 \times 10^{16}$ cm$^{-3}$.

The impurity concentration of the second conductivity type (or the carrier concentration of the second conductivity type) in the second semiconductor region 12 is, for example, not less than $1 \times 10^{17}$ cm$^{-3}$ and not more than $5 \times 10^{17}$ cm$^{-3}$.

The impurity concentration of the first conductivity type (or the carrier concentration of the first conductivity type) in the third semiconductor region 13 is, for example, not less than $1 \times 10^{19}$ cm$^{-3}$ and not more than $1 \times 10^{20}$ cm$^{-3}$.

The impurity concentration of the second conductivity type (or the carrier concentration of the second conductivity type) in the fourth semiconductor region 14 is, for example, not less than $1 \times 10^{19}$ cm$^{-3}$ and $8 \times 10^{20}$ cm$^{-3}$.

The impurity concentration of the first conductivity type (or the carrier concentration of the first conductivity type) in the fifth semiconductor region 15 is, for example, not less than $1 \times 10^{19}$ cm$^{-3}$ and not more than $1 \times 10^{20}$ cm$^{-3}$.

The first conductive member 51 includes, for example, at least one selected from the group consisting of aluminum, copper, nickel, tin, gold, and silver. The first conductive portion 52a of the second conductive member 52 includes, for example, at least one selected from the group consisting of aluminum, copper, titanium, tungsten, and silicon. The second conductive portion 52b of the second conductive member 52 includes, for example, at least one selected from the group consisting of aluminum, copper, tungsten, and silicon. The third conductive member 53 and the fourth conductive member 54 include, for example, polysilicon. The polysilicon may include an impurity. In one example, the first insulating member 41 includes silicon and oxygen. In one example, the second insulating member 42 includes, for example, silicon and oxygen. The second insulating member 42 may include nitrogen.

Second Embodiment

Figure 15:
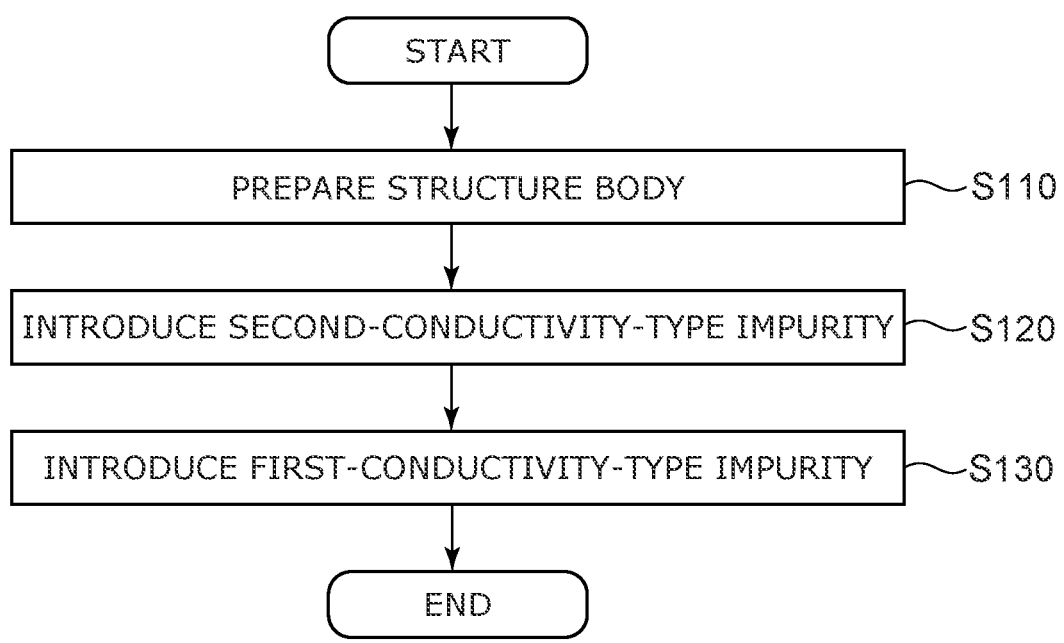
FIG. 15 is a flowchart illustrating a method for manufacturing a semiconductor device according to a second embodiment.

FIG. 15 is a flowchart illustrating a method for manufacturing a semiconductor device according to a second embodiment.

As shown in FIG. 15, the method for manufacturing the semiconductor device according to the second embodiment includes preparing the structure body SB1 that includes two conductive members (the third conductive members 53), the first insulating member 41, and the semiconductor member 10 that includes the first semiconductor region 11F of the first conductivity type (referring to FIG. 4B) (step S110). As described with reference to FIG. 8, for example, the upper surface 41cd of the upper insulating region 41c includes the protruding portion 41cp at the end portion in the second direction (the X-axis direction) of the upper surface 41cd of the upper insulating region 41c. For example, as described with reference to FIG. 4B, the upper insulating region 41c of the first insulating member 41 may include the first insulating portion 41p and the second insulating portion 41q. The first insulating portion 41p is on the second-direction (X-axis direction) central portion of the portion 11d of the first semiconductor region 11F. The second insulating portion 41q is on the end portion 11de in the second direction (the X-axis direction) of the portion 11d of the first semiconductor region 11F. The first thickness t1 along the first direction (the Z-axis direction) of the first insulating portion 41p is less than the second thickness t2 along the first direction of the second insulating portion 41q (referring to FIG. 4B).

As shown in FIG. 15, the manufacturing method includes introducing the impurity 12i of the second conductivity type via the first insulating member 41 described above (step S120). In step S120, the processing described with reference to FIG. 4C is performed.

As shown in FIG. 15, the manufacturing method includes introducing the impurity 13i of the first conductivity type via the first insulating member 41 described above (step S130). In step S130, the processing described with reference to FIG. 4D is performed.

According to the manufacturing method according to the embodiment, for example, the concave first surface F1 and the concave second surface F2 are suppressed. A method for manufacturing a semiconductor device can be provided in which the characteristics can be improved.

Information relating to the configurations of the semiconductor regions, etc., according to embodiments are obtained by, for example, electron microscopy, etc. Information relating to the concentrations of the impurities in the semiconductor regions is obtained by, for example, EDX (Energy Dispersive X-ray Spectroscopy), SIMS (Secondary Ion Mass Spectrometry), etc. In the semiconductor regions, information relating to the carrier concentrations is obtained by, for example, SCM (Scanning Capacitance Microscopy), etc.

According to embodiments, a semiconductor device and a method for manufacturing the semiconductor device can be provided in which the characteristics can be improved.

In the specification, "a state of electrically connected" includes a state in which multiple conductors are physically in contact with each other and a current flows between the multiple conductors. "A state of electrically connected" includes a state in which another conductor is inserted between the multiple conductors and a current flows between the multiple conductors.

Hereinabove, exemplary embodiments of the invention are described with reference to specific examples. However, the embodiments of the invention are not limited to these specific examples. For example, one skilled in the art may similarly practice the invention by appropriately selecting specific configurations of components included in semiconductor devices such as conductive members, semiconductor members, semiconductor regions, insulating members, etc., from known art. Such practice is included in the scope of the invention to the extent that similar effects thereto are obtained.

Further, any two or more components of the specific examples may be combined within the extent of technical feasibility and are included in the scope of the invention to the extent that the purport of the invention is included.

Moreover, all semiconductor devices, and methods for manufacturing the semiconductor memory devices practicable by an appropriate design modification by one skilled in the art based on the semiconductor memory devices, and the methods for manufacturing the semiconductor memory devices described above as embodiments of the invention also are within the scope of the invention to the extent that the purport of the invention is included.

Various other variations and modifications can be conceived by those skilled in the art within the spirit of the invention, and it is understood that such variations and modifications are also encompassed within the scope of the invention.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention,

What is claimed is:

1. A semiconductor device, comprising:
a first conductive member;
a semiconductor member including
   a first semiconductor region provided on the first conductive member, the first semiconductor region being of a first conductivity type,
   a second semiconductor region provided on a portion of the first semiconductor region, the second semiconductor region being of a second conductivity type, and
   a third semiconductor region provided on the second semiconductor region, the third semiconductor region being of the first conductivity type, an impurity concentration of the first conductivity type in the third semiconductor region being greater than an impurity concentration of the first conductivity type in the first semiconductor region;
a second conductive member including a first conductive portion electrically connected to the second and third semiconductor regions;
a third conductive member provided on an other portion of the first semiconductor region, a second direction from the second semiconductor region toward the third conductive member crossing a first direction from the first conductive member toward the first semiconductor region; and
a first insulating member, at least a portion of the first insulating member being between the semiconductor member and the third conductive member, the at least a portion of the first insulating member electrically insulating between the semiconductor member and the third conductive member,
the second semiconductor region including a first surface facing the portion of the first semiconductor region,
the first surface including a first contact portion contacting the first insulating member,
a first distance along the first direction between the first conductive member and a lower end portion of the first surface being less than a second distance along the first direction between the first conductive member and the first contact portion,
the third semiconductor region including a second surface facing the second semiconductor region,
the second surface including a second contact portion contacting the first insulating member,
a third distance along the first direction between the first conductive member and a lower end portion of the second surface being less than a fourth distance along the first direction between the first conductive member and the second contact portion.

2. The device according to claim 1, wherein the third distance is less than a distance along the first direction between the first conductive member and an upper end portion of the third conductive member.

3. The device according to claim 2, wherein the fourth distance is greater than the distance along the first direction between the first conductive member and the upper end portion of the third conductive member.

4. The device according to claim 1, wherein the first distance is less than a distance along the first direction between the first conductive member and a lower end portion of the third conductive member.

5. The device according to claim 1, wherein the first insulating member includes an upper insulating region provided on the third semiconductor region, and an upper surface of the upper insulating region includes a protruding portion provided at an end portion in the second direction of the upper surface of the upper insulating region.

6. The device according to claim 1, wherein the first insulating member includes an upper insulating region provided on the third semiconductor region, the upper insulating region includes a first insulating portion and a second insulating portion, the first insulating portion is between the first conductive portion and the second insulating portion, and a first thickness along the first direction of the first insulating portion is less than a second thickness along the first direction of the second insulating portion.

7. The device according to claim 1, further comprising:
a fourth conductive member,
at least a portion of the fourth conductive member being between the third conductive member and the other portion of the first semiconductor region, a portion of the first insulating member being between the semiconductor member and the fourth conductive member, the portion of the first insulating member electrically insulating between the semiconductor member and the fourth conductive member, the fourth conductive member being electrically connected to one of the second conductive member or the third conductive member or being electrically connectable to the one of the second conductive member or the third conductive member.

8. A semiconductor device, comprising:

a first conductive member;

a semiconductor member including a first semiconductor region provided on the first conductive member, the first semiconductor region being of a first conductivity type, a second semiconductor region provided on a portion of the first semiconductor region, the second semiconductor region being of a second conductivity type, and a third semiconductor region provided on the second semiconductor region, the third semiconductor region being of the first conductivity type, an impurity concentration of the first conductivity type in the third semiconductor region being greater than an impurity concentration of the first conductivity type in the first semiconductor region;

a second conductive member including a first conductive portion electrically connected to the second and third semiconductor regions;

a third conductive member provided on an other portion of the first semiconductor region, a second direction from the second semiconductor region toward the third conductive member crossing a first direction from the first conductive member toward the first semiconductor region; and a first insulating member, at least a portion of the first insulating member being between the semiconductor member and the third conductive member, the at least a portion of the first insulating member electrically insulating between the semiconductor member and the third conductive member, the first insulating member including an upper insulating region provided on the third semiconductor region, an upper surface of the upper insulating region including a protruding portion provided at an end portion in the second direction of the upper surface of the upper insulating region.

9. The device according to claim 1, further comprising:

a fourth conductive member, at least a portion of the fourth conductive member being between the third conductive member and the other portion of the first semiconductor region, a portion of the first insulating member being between the semiconductor member and the fourth conductive member, the portion of the first insulating member electrically insulating between the semiconductor member and the fourth conductive member, the fourth conductive member being electrically connected to one of the second conductive member or the third conductive member or being electrically connectable to the one of the second conductive member or the third conductive member.

* * * * *